United States Patent
Maiti et al.

[11] Patent Number: 6,049,114
[45] Date of Patent: Apr. 11, 2000

[54] SEMICONDUCTOR DEVICE HAVING A METAL CONTAINING LAYER OVERLYING A GATE DIELECTRIC

[75] Inventors: Bikas Maiti; Jon Candelaria; Jian Chen, all of Austin, Tex.

[73] Assignee: Motorola, Inc., Schaumburg, Ill.

[21] Appl. No.: 09/118,877

[22] Filed: Jul. 20, 1998

[51] Int. Cl.[7] .................................................. H01L 29/76
[52] U.S. Cl. ............................................. 257/412; 257/900
[58] Field of Search .................................. 257/412, 900, 257/408

[56] References Cited

U.S. PATENT DOCUMENTS

| | | | |
|---|---|---|---|
| 4,981,810 | 1/1991 | Fazan et al. | 437/44 |
| 5,079,180 | 1/1992 | Rodder et al. | 437/44 |
| 5,089,863 | 2/1992 | Satoh et al. | 257/413 |
| 5,108,939 | 4/1992 | Manley et al. | 437/43 |
| 5,372,960 | 12/1994 | Davies et al. | 437/44 |
| 5,428,240 | 6/1995 | Lur | 257/408 |
| 5,633,522 | 5/1997 | Dorleans et al. | 257/412 |
| 5,900,666 | 5/1999 | Gardner et al. | 257/900 |

Primary Examiner—Mark V. Prenty
Attorney, Agent, or Firm—Robert A. Rodriguez

[57] ABSTRACT

A method of forming a semiconductor device includes providing a substrate (10) and depositing a gate dielectric (12) overlying the substrate (10). A gate is formed overlying the gate dielectric (12). The gate has a first sidewall and comprises a metal-containing layer (14) overlying the gate dielectric (12). A first spacer layer (20) is deposited over the gate and the substrate (10). A portion of the first spacer layer along the first sidewall forms a first spacer (22). A liner layer (30) is deposited over the gate and the substrate (10), and a second spacer layer (32) is deposited over the liner layer (30). The second spacer layer (32) is etched to leave a portion of the second spacer layer (32) along the first sidewall to form a second spacer (34). Also disclosed is a metal gate structure of a semiconductor device.

19 Claims, 4 Drawing Sheets

SEMICONDUCTOR DEVICE HAVING A METAL CONTAINING LAYER OVERLYING A GATE DIELECTRIC

FIELD OF THE INVENTION

The present invention is generally related to a method for forming a semiconductor device and semiconductor device formed thereby. More particularly, the present invention is drawn to a novel gate structure of a semiconductor device.

RELATED ART

As is known in the art of modern semiconductor fabrication, polycrystalline silicon (polysilicon) is generally used to form the gate electrodes in modern transistors. Generally, polysilicon gates are generally doped with n-type or p-type dopants to increase the conductivity of the gate. Despite heavy doping of the polysilicon gate, it remains a semiconductor material. In this regard, as has been recognized in the art, use of doped polysilicon for the gate gives rise to what is known as "poly depletion." Poly depletion arises within the poly gate, upon application of a voltage to the gate. For example, in a P+ doped gate, a negative voltage is applied thereto during operation. By application of the negative voltage, the dopants at the interface between the polysilicon gate and the gate oxide are depleted, giving rise to a capacitance corresponding to the depleted region, herein referred to as $C_P$. The occurrence of $C_P$ in poly gates in the past has not been particularly problematic, since $C_P$ is generally much larger than the capacitance associated with the gate dielectric, herein referred to as $C_{GD}$. However, as newer technologies continue to scale down to smaller dimensions, $C_{GD}$ begins to approach $C_P$. Thus, $C_P$ has more of an impact on device performance, which is problematic since $C_P$ is dependent upon the voltage applied to the gate electrode. Hence performance of the transistor is largely dependent upon the applied voltage, which is highly undesirable.

Accordingly, there has been much interest in replacing polysilicon gates with metal-containing gates to overcome the problems associated with poly depletion. For example, several refractory metals and their nitrides such as Ti, W, and Ta have been demonstrated as feasible metal gate electrodes in MOS (metal oxide semiconductor) technology.

One example of a metal gate semiconductor structure that the present inventor has considered is illustrated in FIG. 11. As illustrated, FIG. 11 depicts a structure having semiconductor substrate 100, a gate dielectric 102, metal gate 104, which may be composed of TiN, for example, polysilicon cap 106, and nitride spacers 108. Source/drains 110 and 112 are also depicted, within field oxide regions 114 and 116. For particular details regarding the method of forming the structure shown in FIG. 11, reference is made to co-pending Application, Attorney Docket No. SC90763A, commonly owned by the present Assignee. While the structure shown in FIG. 11 advantageously makes use of a metal gate 104, several problems exist.

For example, in the case of metal gate 104 being made of TiN, the conventional reoxidation process, to repair damage to the gate dielectric from the patterning step, cannot be carried out. Particularly, TiN is very easily oxidized. Accordingly, upon attempting a thermal oxidation process, a substantial portion of the metal gate 104 would be oxidized. Since the reoxidation process cannot be carried out with the metal gate structure illustrated in FIG. 11, source/drain extensions cannot be formed. Particularly, along the surface of the substrate containing a large number of gate stacks, both n-type and p-type extensions are typically formed, by executing separate doping steps with appropriate masks. When switching from an n-type dopant to a p-type dopant or vice versa, a mask must be removed. Such masks are typically removed by the known "piranha" treatment. However, this piranha treatment undesirably attacks, oxidizes and even removes the metal gate 104. Accordingly, implants cannot be carried out prior to formation of the spacers 108, thus preventing formation of extensions.

In addition, in connection with polysilicon gates, it is known to deposit an oxide layer following the thermal reoxidation treatment. Such an oxide layer may be blanket deposited by reacting TEOS gas, as is known in the art. The deposition of the oxide liner is advantageous with respect to formation of the nitride spacers. Particularly, the oxide liner acts as an etch stop during etching of the nitride spacers, thus preventing unwanted etching into the surface of the substrate. However, such an oxide liner cannot be deposited over the metal gate structure illustrated in FIG. 11 prior to formation of the nitride spacers 108, since such a process would oxidize the metal gate 104.

Accordingly, as is apparent from the foregoing, there are several needs in the art to improve upon metal gate structures. For example, it is desirable to provide a metal gate structure that includes extensions, as well as to provide an etch stop for nitride spacers to prevent unwanted etching into the substrate.

DETAILED DESCRIPTION OF THE DRAWINGS

Figure 1:
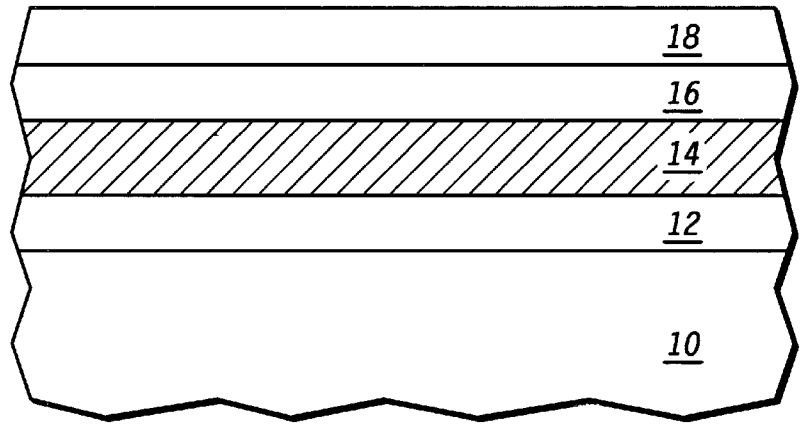
FIG. 1 illustrates a first stage in a process for forming an embodiment of the present invention, wherein a plurality of layers are deposited over a substrate.

Turning to FIG. 1, a first stage in the process flow for forming an embodiment of the present invention is illustrated. Particularly, FIG. 1 illustrates a semiconductor substrate 10 having a plurality of blanket deposited layers formed thereon. The layers include gate dielectric 12, metal gate 14, cap 16, and anti-reflective coating (ARC) 18. The semiconductor substrate 10 may be formed of any one of semiconducting materials, including monocrystalline silicon, polycrystalline silicon, epitaxially grown silicon, silicon-on-insulator (SOI), germanium, etc. The gate dielectric is generally formed of silicon dioxide, via wet, or dry thermal oxidation process as are known in the art. While silicon dioxide is generally used for the gate dielectric, other higher dielectric constant materials may be utilized, such as tantalum pentoxide, silicon nitride, and titanium dioxide. In such a case, those materials would be deposited via a chemical vapor deposition (CVD), or physical vapor deposition (PVD) process. In the case of silicon dioxide, the gate dielectric is preferably quite thin, on the order of 15–40 Angstroms. In the case of a high-k dielectric material, the thickness may be increased, such as on the order of 50–200 Angstroms, while maintaining desirable device performance.

Metal gate 14 comprises metal material, such as Ti, Ta, W, Mo, Hf, Y, V, or Ir. Preferably, the metal gate contains Ti, Ta, or W. Metal gate 14 may also be desirably formed of a nitride of one of the above mentioned materials. Metal gate 14 may be deposited by CVD or PVD, and generally has a thickness on the order of 100–2,000 Angstroms. The cap 16 is generally formed of a nitride or polysilicon material, provided to protect the metal gate 14 from oxidation during subsequent thermal oxidation steps carried in later steps during the process flow for forming a completed integrated circuit. The ARC 18 generally comprises silicon nitride, and functions to absorb energy reflected from the gate during patterning of the layers, to prevent notching in the photoresist that is deposited over the layers.

Figure 2:
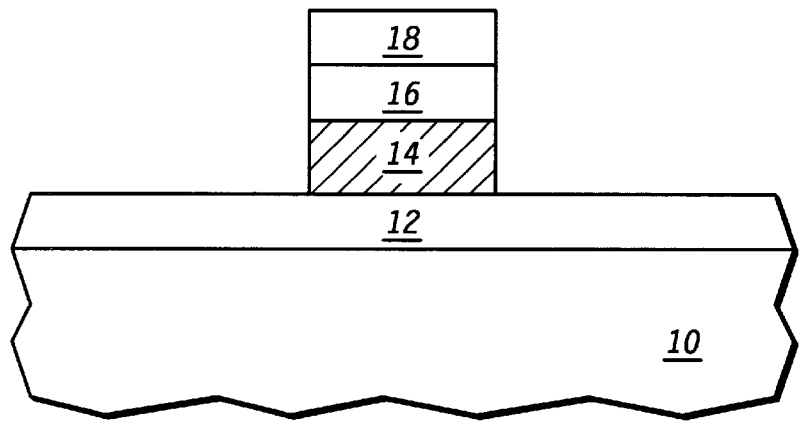
FIG. 2 illustrates patterning the deposited layers illustrated in FIG. 1 to form a gate stack.

FIG. 2 illustrates another step in the process flow according to an embodiment of the present invention, after the layers are patterned. Patterning is carried out by depositing an appropriate photoresist, exposing the photoresist, and etching layers 14 through 18. The particular details of the patterning are not discussed herein, and are commonly understood by one of ordinary skill in the art.

Figure 3:
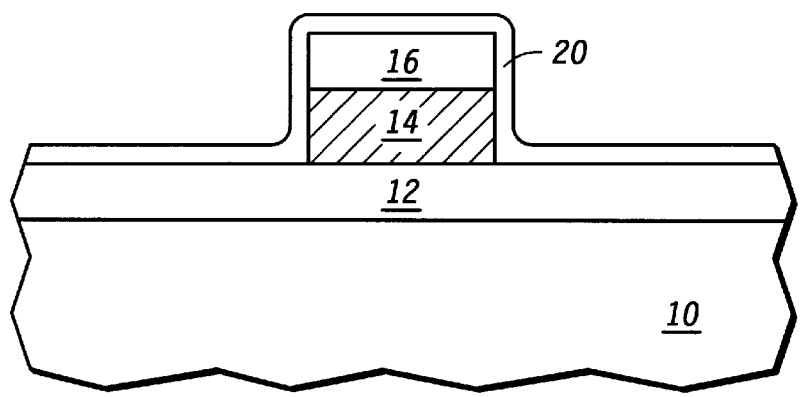
FIGS. 3 and 4 illustrate formation of a first nitride spacer according to an embodiment of the present invention.
Figure 4:
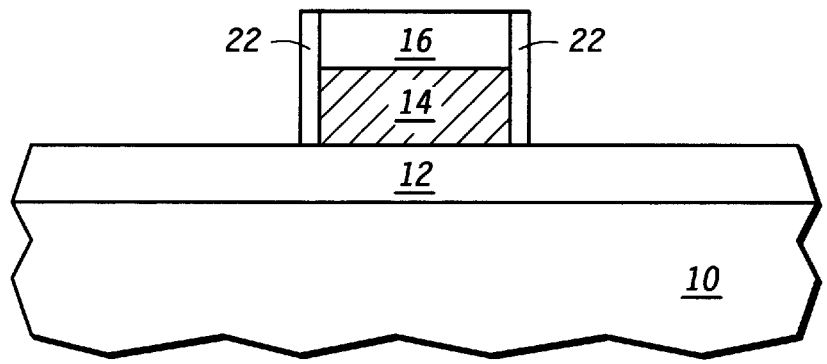
Figure 5:
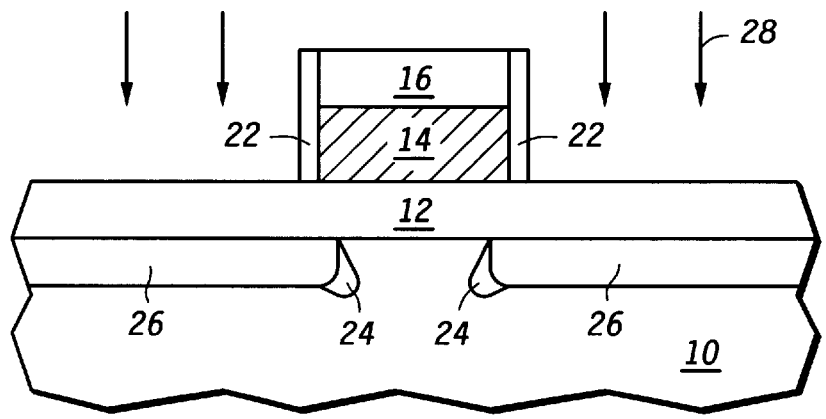
FIG. 5 illustrates doping to form doped regions in the substrate, particularly, halo regions and extensions.
Figure 6:
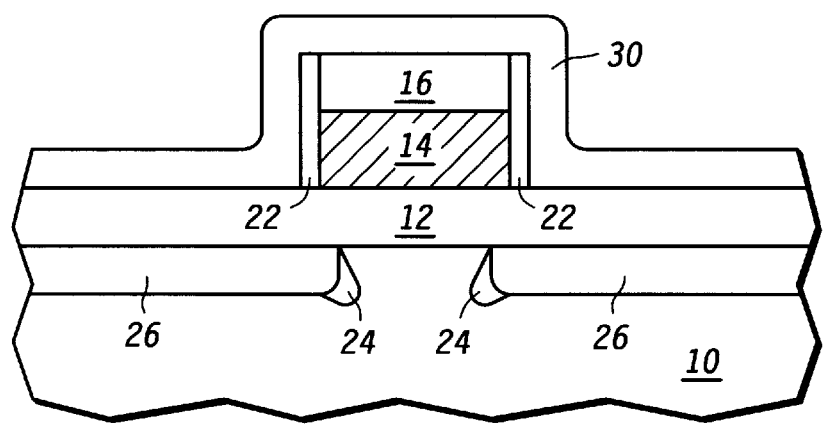
FIGS. 6–8 illustrate formation of an oxide layer and second spacers according to an embodiment of the present invention.
Figure 7:
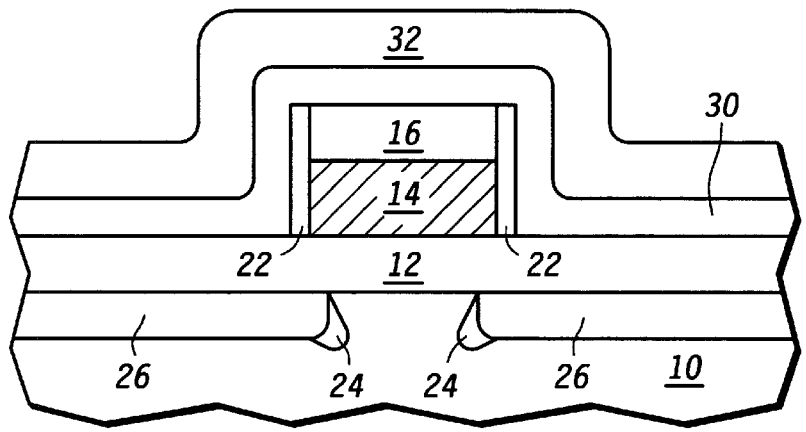

Following removal of ARC 18, a thin layer of dielectric material is blanket deposited to form a first spacer layer 20. The first spacer layer 20 comprises silicon nitride, but may be formed of other dielectric materials, provided that first spacer layer 20 does not contain oxygen, which would react with the metal gate 14. The first spacer layer 20 blanket deposited by any one of known techniques, including CVD, PVD, and rapid thermal CVD (RTCVD), and has a thickness generally on the order of 50–200 Angstroms. Then, as shown in FIG. 4, the first spacer layer 20 is patterned, leaving behind a first spacer 22, overlying the sidewalls of the gate. First spacer 22 is formed by anisotropically etching the first spacer layer 20, thereby removing the horizontal portions of the first spacer layer 20 and leaving behind first spacer 22. Alternatively blanket deposited first spacer layer 20 can be left intact and etched after removal of the liner layer 30 which will be described further herein below. In this case, the patterning step illustrated in FIG. 4 would not occur, and process would flow from FIG. 3 to FIG. 5.

Several doping steps are then carried out to form halo regions 24 and source/drain extensions 26. The extensions 26 and the halo regions 24 are formed of respectively different conductivity types. For example, halo regions 24 may comprise n-type dopants while extensions 26 may contain p-type dopants. The halo regions 24 and the extensions 26 may be formed in any order. The halo region may be formed by implanting the dopants at an angle with respect to the plane of the substrate, thus driving the dopants under the gate, as shown. On the other hand, extensions 26 may be formed by implanting the dopants in a vertical direction, as illustrated by arrows 28 in FIG. 5. Following implant, an anneal step is executed to drive the dopants and form the extensions and halo regions as shown in the drawings. Doping levels for the extensions 26 are generally on the order of $1e19–5e20/cm^3$. Doping levels for the halo regions 24 are generally on the order of $1e18/cm^3$.

Figure 11:
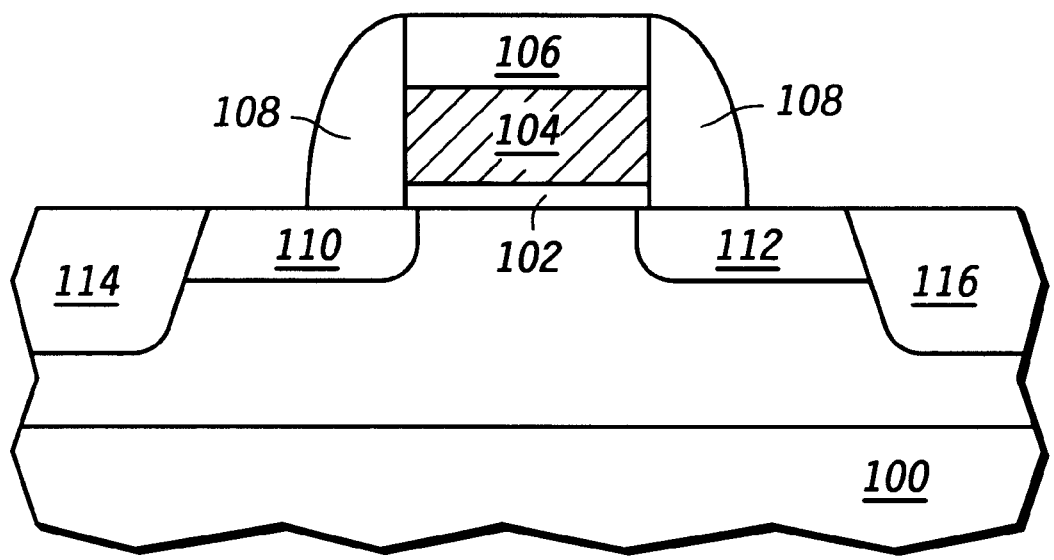
FIG. 11 illustrates a semiconductor structure incorporating a metal gate.

Unlike the structure illustrated in FIG. 11, according to the present invention, since a relatively thin first spacer 22 is first provided, the gate is protected to permit formation of a doped region, including extensions 26 and halo regions 24. That is, the first spacer 22 protects the exposed sidewalls of the gate, while cap 16 protects the top of the gate. Accordingly, appropriate masks may be deposited along the substrate to permit formation of both n-type and p-type halo regions 24 and extensions 26. According to the present invention, the metal gate is not exposed to the chemistry of the piranha clean which is used to remove the mask when switching between n-type and p-type dopants.

Figure 8:
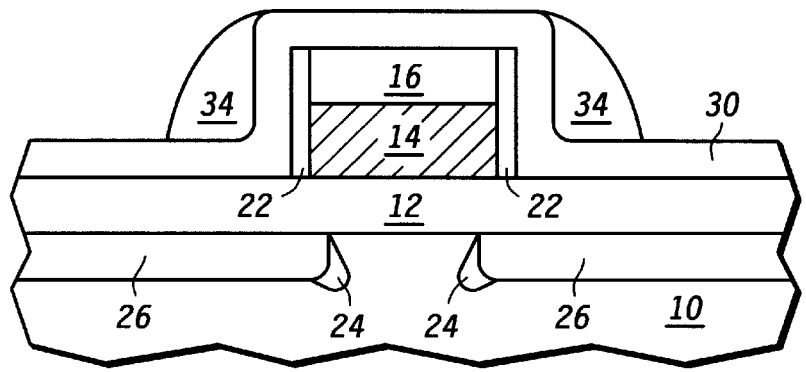
Figure 9:
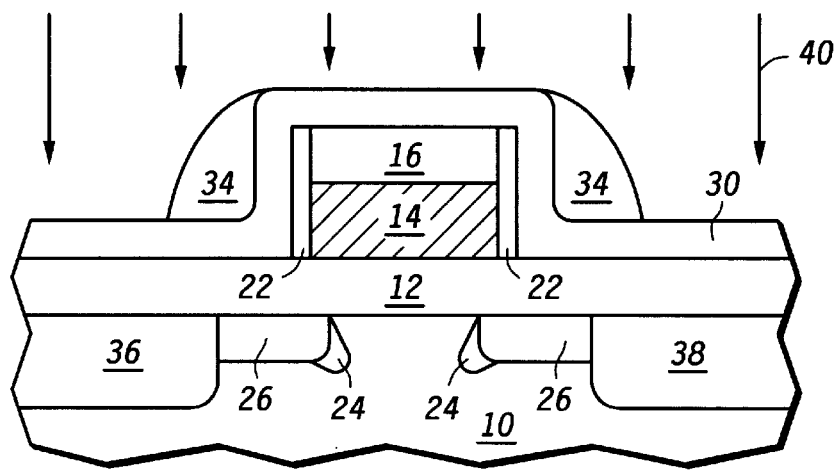
FIG. 9 illustrates a doping step to form source/drain regions according to an embodiment of the present invention.

Following extension and halo region implants, a liner layer 30 is blanket deposited. In the present embodiment, liner 30 is comprised of silicon dioxide, which may be deposited by reacting TEOS gas. Liner 30 generally has a thickness on the order of 50–250 Angstroms. Following formation of liner 30, a second spacer layer 32 is deposited, which has a thickness generally greater than the first spacer layer 20. Here, the second spacer layer 32 has a thickness of the order of 500–1,000 Angstroms, and is generally formed of the same material as the first spacer layer 20, such as silicon nitride, but may be formed of a different material if so desired to optimize properties thereof. An important consideration in choosing the appropriate materials for liner 30 and second spacer layer 32 is the particular etchant used for formation of the second spacer 34 depicted in FIG. 8. That is, the liner 30 functions as an etch stop for the etchant utilized to form the second spacer 34. Following formation of second spacer 34, the main source/drain implants may be carried out as illustrated by arrows 40 in FIG. 9. Following implant, an anneal step is executed to drive the dopants and form the source/drain regions 36, 38. As is known in the art, source/drain regions 36, 38 are self-aligned to the gate, particularly, self-aligned to the gate including second spacers 34, as illustrated in FIG. 9. Doping levels for the source/drain regions 36, 38 are generally on the order of $3e20–5e21/cm^3$.

The dopants in the extensions 26 are implanted at a lower energy level as compared to the source/drain regions 36, 38 so as to provide a shallower region. The source/drain regions 36, 38 have a depth generally on the order of 750–1500 Angstroms, while the extensions 26 have a depth generally on the order of 100–500 Angstroms. The shallow extensions are important to enable the gate to control the channel reproducibly. The doping levels of the source/drain regions 36, 38 and the extensions 26 can be similar, but generally, the extensions 26 have a lower doping level than the source/drain regions 36, 38.

According to the embodiment illustrated, the first spacer is relatively thin, generally on the order of 50 to 200 Angstroms, preferably, 50 to 150 Angstroms, while the second spacer has a maximum thickness (along the base thereof contacting the gate oxide) that is substantially thicker, on the order of 500 to 1,000 Angstroms. The difference in thicknesses is important to allow formation of an extension that extends under the gate, and, in the same structure, a more heavily doped source/drain region that is placed outward of the extension.

Figure 10:
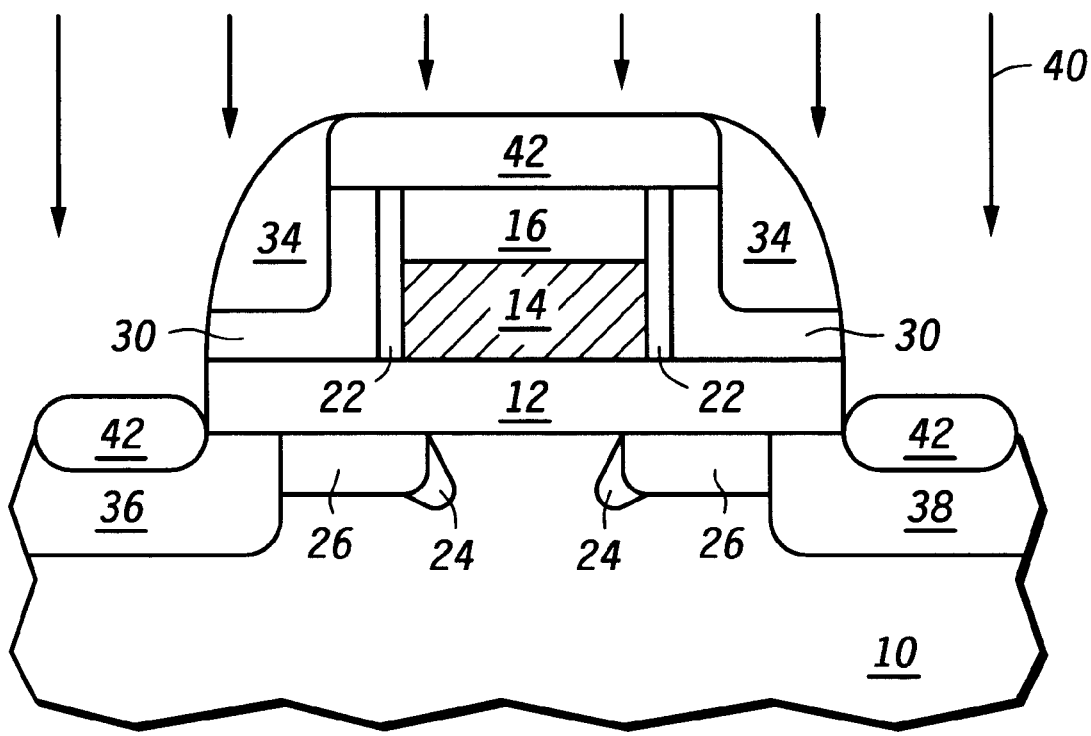
FIG. 10 illustrates silicidation of the semiconductor structure.

The semiconductor structure may be completed for further processing, such as formation of contacts and higher level interconnects with appropriate interlayer dielectrics, by silicidation of exposed silicon-containing regions, as shown in FIG. 10. Particularly, a conductive material that is reactive with silicon, such as Co or Ti, is reacted with exposed regions containing silicon to form silicide regions 42 as illustrated in FIG. 10. As is known, the silicide regions provide ohmic contact for vias and contacts which are formed in later processing steps. It is noted that prior to the silicidation, exposed regions of liner 30 are removed by etching. Furthermore, if the first spacer layer 20 was left intact throughout the process, the etching chemistries are changed, and the exposed portions of the first spacer layer 20 are now removed as well.

As has been described above, a novel technique for forming a semiconductor device and a semiconductor device formed thereby has been disclosed, in which a metal gate is incorporated in the process flow. According to the embodiment of the present invention described above, formation of separate, first and second spacers with an intermediate liner enables formation of extensions and halo regions, in a metal gate structure. In addition, the liner acts as an etch stop to prevent unwanted etching into the semiconductor substrate during formation of the second spacers. This is particularly critical when utilizing an SOI substrate, since the epitaxially grown silicon is generally of a relatively small thickness. In such a case, unwanted etching into the substrate can have a marked impact on device operation.

While an embodiment of the present invention has been described above with particular detail, it is understood that one of ordinary skill in the art may make modifications thereto and variations thereon yet still fall within the scope of the following claims.

What is claimed is:

1. A semiconductor device, comprising:
    a substrate;
    a gate dielectric overlying the substrate;
    a gate overlying the gate dielectric, wherein the gate has a first sidewall and comprises a metal-containing layer overlying the gate dielectric and a cap layer overlying the metal-containing layer;
    a first spacer on the first sidewall, wherein the first spacer consists of a non oxygen-containing compound and has a thickness in a range of approximately 50–200 Angstroms;
    a liner layer on the first spacer and overlying a portion of the substrate; and
    a second spacer on the liner layer.

2. The semiconductor device of claim 1, wherein the cap layer includes a material selected from the group consisting of a polysilicon and a nitride.

3. The semiconductor device of claim 1, wherein the metal-containing layer includes a metal selected from the group consisting of titanium, tantalum, tungsten, and molybdenum.

4. The semiconductor device of claim 3, wherein the metal-containing layer comprises a nitride of said metal.

5. The semiconductor device of claim 1, wherein the first spacer includes a nitride.

6. The semiconductor device of claim 1, wherein the second spacer includes a nitride.

7. The semiconductor device of claim 1, wherein the liner layer includes an oxide and has a thickness in a range of approximately 50 Angstroms to 250 Angstroms.

8. The semiconductor device of claim 1, wherein the second spacer has a maximum thickness greater than the thickness of the first spacer.

9. The semiconductor device of claim 1, wherein the substrate has doped regions underlying the first spacer.

10. The semiconductor device of claim 9, wherein the doped regions comprise an extension extending under the second spacer.

11. A semiconductor device, comprising:
    a substrate;
    a gate dielectric overlying the substrate;
    a gate overlying the gate dielectric, wherein the gate has a first sidewall and comprises a metal-containing layer overlying the gate dielectric and a cap layer overlying the metal-containing layer;
    a first spacer on the first sidewall, wherein the first spacer includes a nitride;
    a liner layer on the first spacer and overlying a portion of the substrate; and
    a second spacer on the liner layer, wherein the second spacer has a maximum thickness that is greater than the thickness of the first spacer.

12. The semiconductor device of claim 11, wherein the cap layer includes a material selected from the group consisting of a polysilicon and a nitride.

13. The semiconductor device of claim 11, wherein the metal-containing layer includes a metal selected from the group consisting of titanium, tantalum, tungsten, and molybdenum.

14. The semiconductor device of claim 13, wherein the metal-containing layer comprises a nitride of said metal.

15. The semiconductor device of claim 11, wherein the second spacer includes a nitride.

16. The semiconductor device of claim 11, wherein the liner layer includes an oxide and has a thickness in a range of approximately 50 Angstroms to 250 Angstroms.

17. The semiconductor device of claim 11, wherein the first spacer has a thickness in a range of approximately 50 Angstroms to 200 Angstroms.

18. The semiconductor device of claim 11, wherein the substrate has doped regions underlying the first spacer.

19. The semiconductor device of claim 18, wherein the doped regions comprise an extension extending under the second spacer.

* * * * *